United States Patent [19]
Fischer

[11] Patent Number: 5,381,085
[45] Date of Patent: Jan. 10, 1995

[54] PHASE LOCK LOOP WITH SELF TEST CIRCUITRY AND METHOD FOR USING THE SAME

[75] Inventor: Lynn R. Fischer, Mesa, Ariz.
[73] Assignee: Motorola, Inc., Schaumburg, Ill.
[21] Appl. No.: 89,912
[22] Filed: Jul. 6, 1993
[51] Int. Cl.6 .................................... G01R 23/02
[52] U.S. Cl. ................... 324/76.48; 377/39; 331/44; 327/159
[58] Field of Search ................ 377/39, 56; 328/155; 331/44; 327/76.48

[56] References Cited

U.S. PATENT DOCUMENTS

| | | | |
|---|---|---|---|
| 3,878,370 | 4/1975 | Santomango et al. | 377/39 |
| 4,533,867 | 8/1985 | Witczac | 324/76.48 |
| 4,608,706 | 8/1986 | Chang et al. | 377/39 |
| 4,786,861 | 11/1988 | Hulsing et al. | 324/76.48 |
| 5,089,770 | 2/1992 | Lee et al. | 324/76.48 |

Primary Examiner—John S. Heyman
Attorney, Agent, or Firm—Gary W. Hoshizaki

[57] ABSTRACT

A built in self test circuit for testing a phase lock loop (11). The built in self test circuitry comprises a pulse circuit (13), an And gate (19), a counter circuit (23), and an output multiplexer (24). The phase lock loop (11) receives a reference signal and generates an output signal. The pulse circuit (13) receives the reference signal and generates a pulse having a duration some multiple of the output signal of the phase lock loop. The And gate (19) receives the pulse output by pulse circuit (13) and the output signal of the phase lock loop (11) generating a string of pulses having the frequency of the output signal of the phase lock loop (11) for the duration of the pulse output by the pulse circuit (13). The counter circuit (23) receives the string of pulses and generates a count of the pulses. The count is compared to an expected count to determine the accuracy of the phase lock loop (11).

15 Claims, 3 Drawing Sheets

PHASE LOCK LOOP WITH SELF TEST CIRCUITRY AND METHOD FOR USING THE SAME

BACKGROUND OF THE INVENTION

This invention relates, in general, to phase lock loop testing, and more particularly to a built in self test for a phase lock loop.

It is well known by those skilled in the art that phase lock loop circuits provide a signal of a predetermined frequency. The speed and accuracy of currently manufactured phase lock loops has advanced to the point where outboard testing of a phase lock loop (PLL) may not be possible or cost effective. Testing of a PLL typically involves a functional test (determining whether the PLL locks to a frequency), the frequency range of the PLL, and the accuracy of the frequency generated by the PLL.

Many phase lock loops are programmable for a range of output frequencies. A reference frequency is input to the PLL and the PLL is programmed to generate a specific output frequency. The stability and accuracy of the reference frequency directly impacts the performance characteristics of the PLL. For example, a programmable PLL having a frequency range of 20-120 megahertz (MHz) might use a reference frequency of 15 MHz. Generally, testing requires knowledge of the programmable relationship between the reference frequency and the PLL output frequency, an accurate measurement of the reference frequency, and an accurate measurement of the PLL output frequency. The use of automated external test equipment to measure frequencies in excess of 100 MHz is difficult. External test requires inputs and outputs of the PLL to be brought to pins that can be coupled to the tester, thereby reducing the number of pins available and also increasing parasitic loading on the PLL. Furthermore, some PLL's are embedded within a semiconductor chip and not accessible to a tester. It would be of great benefit if a method for testing a PLL could be provided which eliminates the need for external testing, uses minimal circuitry, and provides accurate characterization of the PLL.

Summary of the Invention

Briefly stated, this invention comprises a phase lock loop with self test circuitry. The phase lock loop includes an input for receiving an input signal of a first frequency and an output for providing an output signal of a second frequency. The self test circuitry comprises a pulse circuit, an And gate, and a counter circuit. The pulse circuit includes an input for receiving the input signal of the first frequency and an output for providing a pulse having a predetermined period. The And gate includes an input coupled for receiving the pulse, an input coupled for receiving the output signal of the phase lock loop, and an output. The And gate generates a series of pulses of the second frequency during the predetermined period of the pulse. The counter circuit includes an input coupled to the output of the And gate and a plurality of outputs for providing a count of the series of pulses.

The method for self testing a phase lock loop comprises, generating a window of time some multiple of the reference frequency. Counting pulses of the output signal of the phase lock loop during the window of time. Comparing a count of the pulses during the window of time with an expected count to determine the phase lock loop accuracy.

DETAILED DESCRIPTION OF THE DRAWINGS

Figure 1:
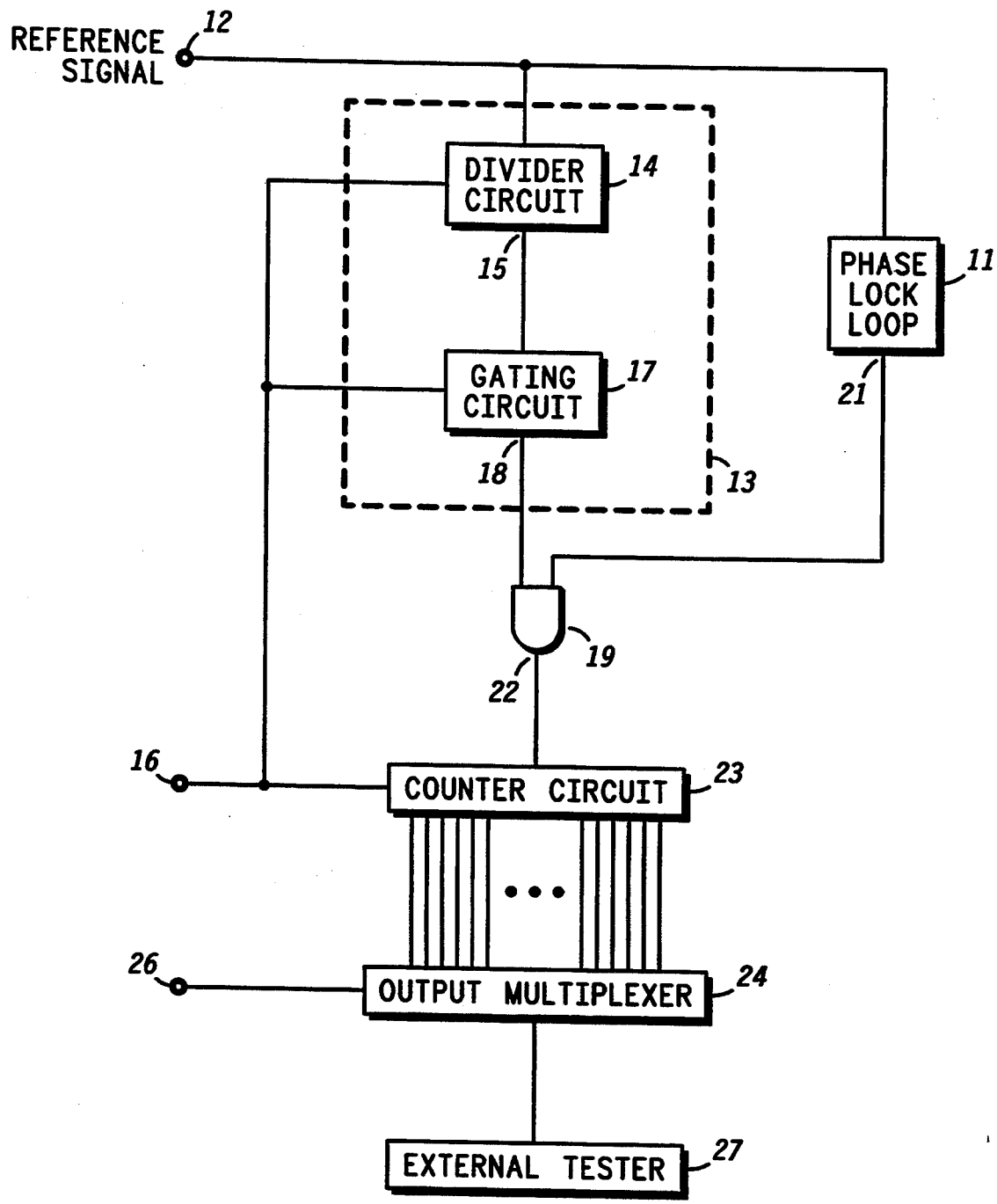
FIG. 1 is a block diagram of a phase lock loop and self test circuitry in accordance with the present invention.

FIG. 1 is a block diagram of a phase lock loop 11 and self test circuitry suitable for manufacture as an integrated circuit in accordance with the present invention.

Built in self test circuitry for phase lock loop 11 is capable of testing functionality, range, and accuracy with almost no interaction from an external tester. Testing of phase lock loop 11 occurs simultaneously (or in parallel) with testing of other circuitry that requires interaction with the external tester. This increases test speed, decreases programming requirements for test equipment, eliminates additional pin outs, and reduces loading on phase lock loop 11. The built in self test circuitry does not take a significant amount of area on a semiconductor die and is compatible with componentry available in gate arrays or standard cell based circuits.

It is well known by one skilled in the art that phase lock loop 11, in general, requires an input signal or a reference signal to synthesize an output signal of a predetermined frequency. If phase lock loop 11 is programmable, it can be programmed to deliver a range of frequencies. A key point to self test is that the accuracy of the phase lock loop is directly related to the quality of the reference signal. Typically, the reference signal is generated from a crystal oscillator or other circuitry that is known to produce an extremely accurate frequency. The reference signal is the focal point on which the self test is based because the output signal frequency of phase lock loop 11 is some "known" multiple of the reference signal frequency. The self test circuitry generates a signal from the reference signal which is used to measure the accuracy of the output signal of phase lock loop 11. This procedure will be discussed in greater detail later in the specification.

Phase lock loop 11 includes an input coupled to an input 12 and an output 21 for providing the output signal that is some multiple of the reference signal applied to input 12. For example, assume the reference signal has a frequency of 15 megahertz (MHz) and phase lock loop 11 is programmed to produce an output signal of 80 MHz. The ratio between the output signal and the reference signal is approximately 5.333. If the reference signal is not exactly 15 MHz, for example 14 MHz, the ratio between input and output would remain at 5.333 but the output signal would have a frequency of 74.667 MHz. The ratio between the output signal and the input signal is either programmed into the phase lock loop or designed in as a constant. This ratio is known prior to testing and is used for the test. The self test circuitry does not measure the reference signal frequency or the output signal frequency of phase lock loop 11, instead the ratio between the reference signal and the output signal of phase lock loop 11 is measured and compared against the known ratio (5.333 from the example above) programmed into phase lock loop 11. The difference between the measured ratio and the known ratio determines the accuracy of phase lock loop 11. Multiple measurements are made, if necessary, to create a map of the measured ratios over the frequency range of phase lock loop 11 for the reference signal. The measurements can be stored in memory and used to correct frequency deviations of phase lock loop 11.

The self test circuitry counts the number of cycles or pulses output by phase lock loop 11 during a predetermined period of time. A pulse circuit 13 creates the predetermined time by generating a pulse having a duration of the predetermined time. The pulse is used to create a "window of time" in which the output signal of phase lock loop 11 is monitored. In the preferred embodiment, the window of time is significantly larger than the period of the output signal of phase lock loop 11. The window of time is generated from the reference signal to insure accuracy. A direct time relationship exists between the reference signal and the period of the pulse. Pulse circuit 13 includes an input coupled to input 12 (to receive the reference signal) and an output for providing the pulse.

In the preferred embodiment, pulse circuit 13 comprises a divider circuit 14 and a gating circuit 17. The duration of the pulse output by pulse circuit 13 is directly related to the accuracy in which the output signal of phase lock loop 11 can measured. The longer the duration of the pulse, the more accurate the measurement. The only limitations to using a long duration pulse is the increased test time and the amount of circuitry needed for the self test circuitry. Divider circuit 14 has an input corresponding to the input of pulse circuit 13, a reset input coupled to a reset input 16, and an output 15. A reset signal applied to input 16 initializes divider circuit 14 to a preset state that allows testing. The input of divider circuit 14 receives the reference signal which is divided down to produce an output signal of a lower frequency at the output of divider circuit 14.

Figure 2:
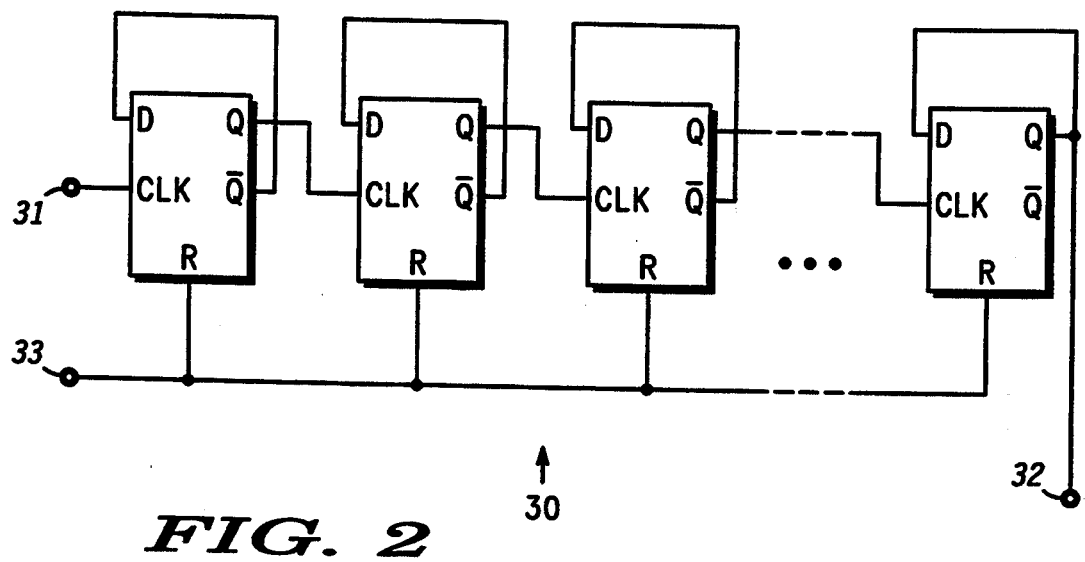
FIG. 2 is a schematic of a divider circuit in accordance with the present invention.

In the preferred embodiment, divider circuit 14 is similar to a divider circuit 30 illustrated in FIG. 2. Divider circuit 30 has a clock input 31, a reset input 33, and an output 32. Divider circuit 30 comprises a string of series clocked D-flip flops. Each D-flip flop is configured having its Qbar output coupled to its D-input to produce a signal at its Q output having a frequency half that of a signal received at its clock input.

A reset signal received at reset input 33 initializes divider circuit 30 to a preset state. Each D-flip flop has its reset input coupled to reset input 33. The reset signal sets the Q output of each D-flip flop in divider circuit 30 to a zero logic state. Reset input 33 corresponds to the reset input of divider circuit 14 (FIG. 1).

A first D-flip flop of the series clocked D-flip flops has its clock input coupled to clock input 31. Clock input 31 corresponds to the input of pulse circuit 13 coupled to input 12 (both of FIG. 1). With the exception of the first D-flip flop of the series clocked D-flip flops, each clock input is coupled to a Q output of a preceeding D-flip flop. The last D-flop of the series clocked D-flip flops has a Q output coupled to output 32. Output 32 corresponds to output 15 of divider circuit 14. The period of the signal at output 32 is determined by the number of D-flip flops and the frequency of a signal coupled to input 31. For example, if divider circuit 30 has 10 series clocked D-flip flops it will produce a signal at output 32 having a period $2^{10}$ longer than a signal at clock input 31.

Referring back to FIG. 1, output 15 of divider circuit 14 is coupled to an input of a gating circuit 17o Gating circuit 17 includes the input coupled to output 15 of divider circuit 14, a reset input coupled to reset input 16, and an output 18. Gating circuit 17 generates a pulse having a duration of the predetermined time described above. Gating circuit 17 produces only one pulse during a phase lock loop test cycle. The reset signal applied to input 16 resets gating circuit 17 thereby initializing gating circuit 17 to a preset state that allows testing. Output 18 of gating circuit 17 corresponds to the output of pulse circuit 13.

Figure 3:
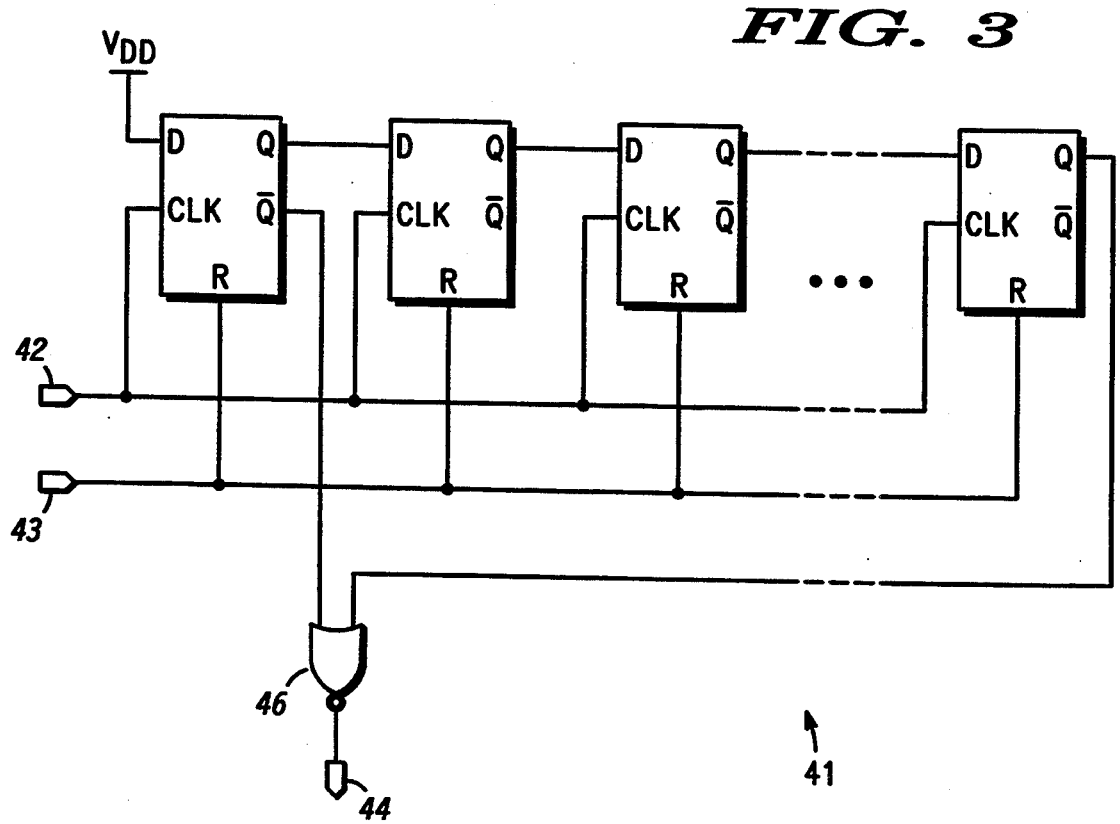
FIG. 3 is a schematic of a gating circuit in accordance with the present invention.

In the preferred embodiment, gating circuit 17 is similar to the gating circuit 41 illustrated in FIG. 3. Gating circuit 41 includes a clock input 42, a reset input 43, and an output 44. Clock input 42, reset input 43, and output 44 respectively corresponds to the input, the reset input, and output of gating circuit 17. Gating circuit 41 comprises a shift register composed of D-flip flops and a nor gate 46.

Shift registers are well known in the circuit design arts. In FIG. 3 the shift register shown is used as a delay line and to form a single pulse. A first D-flip flop of the shift register has a D-input coupled to a terminal of a power supply Vdd. In other words, a one logic state is coupled to the D-input of the first D-flip flop. Each D-input of each D-flip flop (other than the first D-flip flop) is coupled to a Q output of a preceeding D-flip flop. Each clock input of each D-flip flop is coupled to clock input 42. Each reset input of each D-flip flop is coupled to reset input 43. Nor gate 46 includes an input coupled to a Qbar output of the first D-flip flop of the shift register, an input coupled to a Q output of the last D-flip of the shift register, and an output coupled to output 44.

The shift register is reset by a signal applied to reset input 43 prior to the phase lock loop test cycle. Each Q output of each D-flip flop of the shift register is at a zero logic state. A one logic state is output at the Qbar output of the first D-flip flop holding the output of nor gate 46 in a zero logic state. A clock signal applied to clock input 42 shifts out a one logic state at the Q output and a zero logic state at the Qbar output of the first D-flip flop. The output of nor gate 46 transitions to a one logic state starting the single pulse. Each clock signal applied to clock input 42 shifts the one logic state to the Q-output of the next D-flip flop. For example, assume the shift register is composed of 7 D-flip flops. It would take 7 clock cycles at clock input 42 to shift a one logic state to the Q output of the last D-flip flop of the shift register. Thus the delay created by the shift register is equal to 7 clock cycles. The pulse begins with the first clock signal after the reset signal and ends when a one logic state shifts out of the Q output of the last D-flip flop of the shift register. The one logic state at the Q output of the last D-flip flop of the shift register produces a zero logic state at the output of nor gate 46. Further clocking of the shift register will not produce a pulse unless gating circuit 41 is reset. The duration of the pulse at output 44 is determined by the number of shift registers and the period of the clock signal applied to input 42.

Referring back to FIG. 1, an And gate 19 includes an input coupled to output 18 of gating circuit 17, an input coupled to output 21 of phase lock loop 11 and an output 22. And gate 19 generates a string of pulses having the frequency equal to the signal output by phase lock loop 11 for the duration of the pulse generated by pulse circuit 13. A counter circuit 23 counts the pulses output by And gate 19. Counter circuit 23 includes an input coupled to output 22 of And gate 19, a reset input coupled to reset input 16, and a plurality of outputs for providing a count. Prior to the phase lock loop test cycle, counter circuit 23 is initialized to zero by the reset signal applied to reset input 16. Counter circuit 23 must be fast enough to count the output frequency of phase lock loop 11 and it must be able to count the total number of pulses output by And gate 19. An output multiplexer 24 ports the count of counter 23 to an external tester 27. External tester 27 is separate from and is not integrated on the same semiconductor die as the self test circuitry and phase lock loop 11 are. It is well known that multiplexers are designed for parallel or serial shifting of data. Output multiplexer 24 is a serial multiplexer (although a parallel output multiplexer could be used). The serial multiplexer minimizes the number of pins needed to port the count to external tester 27. Output multiplexer 24 has a plurality of inputs for receiving the count, the plurality of inputs correspond to and couple to the plurality of outputs from counter circuit 23. Output multiplexer 24 also has a control input for controlling serial shifting of the count. Once the count from counter 23 is ported to the external tester, the count is compared to an expected count to determine any error produced by phase lock loop 11. The self test circuit can be reset by applying another reset signal to input 16 for retesting phase lock loop 11 or for testing phase lock loop 11 at a different frequency. The range of phase lock loop 11 can be determined by operating phase lock loop 11 at its lowest frequency and generating a low frequency count, porting the low frequency count to the external tester, resetting the self test circuitry, operating phase lock loop 11 at its highest frequency and generating a high frequency count. If the reference frequency and the frequency multiplication ratio is known the minimum and maximum frequency range of phase lock loop 11 can be calculated from the low and high frequency count.

Figure 4:
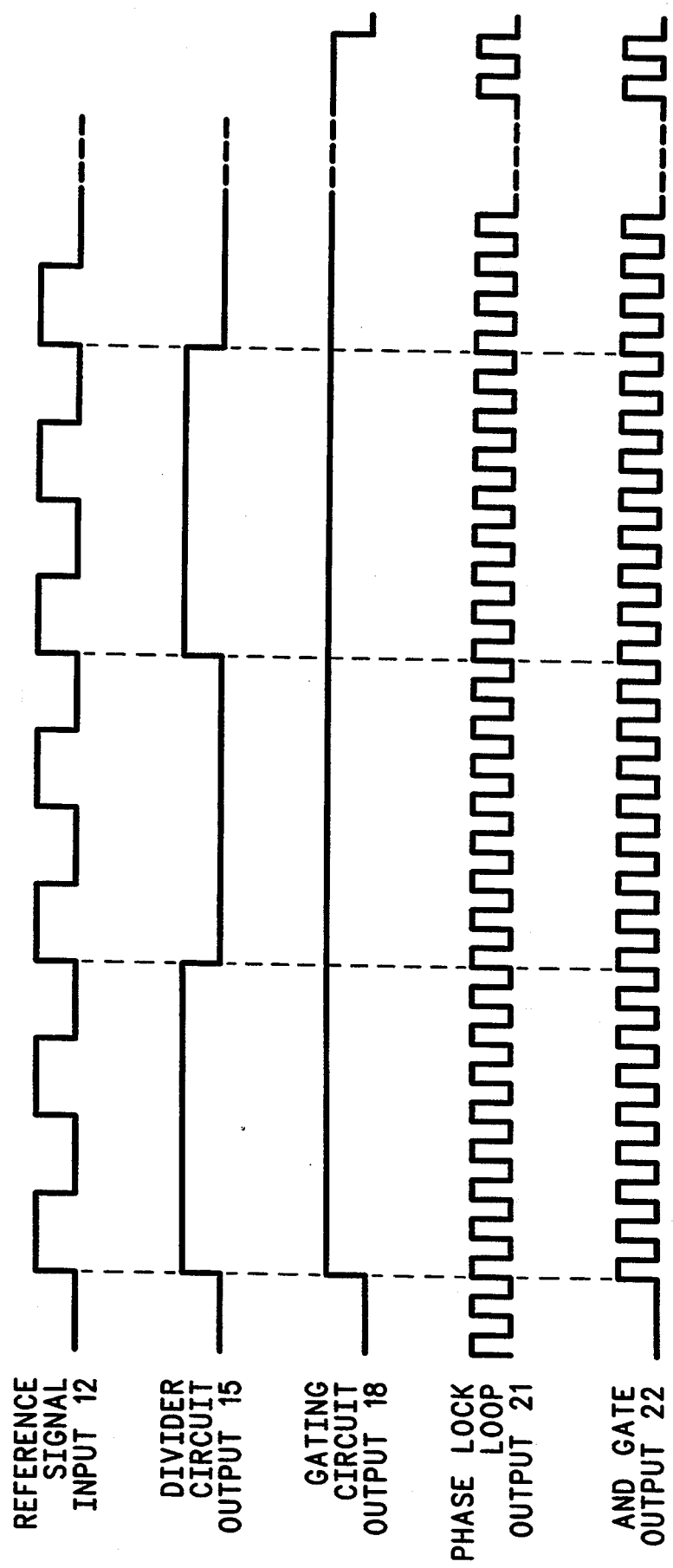
FIG. 4 is a timing diagram of the phase lock loop and self test circuitry of FIG. 1.

A simplified timing diagram of the self test circuitry and phase lock loop 11 is illustrated in FIG. 4. The simplified timing diagram corresponds to circuitry in FIG. 1. Although not shown, assume the self test circuitry has been reset to allow testing of phase lock loop 11. The reference signal is applied to input 12 which couples to both phase lock loop 11 and divider circuit 14. Divider circuit 14 produces a signal having a lower frequency than the reference signal. Divider circuit 14, under normal operating conditions would produce a frequency significantly lower than illustrated but would not be easily diagrammable. Gating circuit 17 receives the signal output by divider circuit 14 and produces the pulse that is a multiple of the reference signal. And gate 19 receives both the signal from output 18 and the signal from output 21 of phase lock loop 11. And gate 19 produces the string of pulses having the frequency of the signal output by phase lock loop 11 for a duration of the pulse output by gating circuit 17. The string of pulses is then counted by counter circuit 23 and the result ported to external tester 27 by output multiplexer 24.

For example, assume the reference signal applied to input 12 is 10 MHz. Phase lock loop 11 is programmed to generate a 40 MHz signal. The frequency multiplication ratio between the output signal and the reference signal is 4.0. Assume divider circuit 14 is similar to that described in FIG. 2 and has 14 D-flip flops. Divider circuit 14 will lower the 10 MHz reference signal by $2^{14}$ which calculates to a signal of approximately 610.352 hertz. The period of a 610.352 hertz signal is 1.6384 milliseconds. Assume gating circuit 17 is similar to that described in FIG. 3 and has 6 D-flip flops in the shift register. Gating circuit 17 will produce the pulse having a duration of 5 * 1.6384 milliseconds or 8.192 milliseconds. A 40 MHz signal has a period of 25 nanoseconds. Theoretically, 8.192 milliseconds/25 nanoseconds equals 327,680 which is the count expected for phase lock loop 11 generating exactly a 40 MHz signal. Deviation from the 327,680 count would imply that phase lock loop 11 is off in frequency (assuming the reference signal is accurate). Assume the count measured was 327,675, the percent error is (1-327,675/327,680) * 100 which is approximately 0.001526 percent error. This translates to a frequency error of approximately 610.4 hertz. External tester 27 is programmed to calculate the expected count and error. External tester 27 also determines whether the error is acceptable range. Phase lock loops falling outside the acceptable range are considered bad parts. As mentioned previously, an increase in the duration of the pulse generated by pulse circuit 13 increases the expected count which yields a measurement of increased accuracy at the expense of more circuitry and test time.

By now it should be appreciated that a self test circuit for a phase lock loop has been described. The self test circuitry is easily integrated with the phase lock loop within a single integrated circuit, reduces external tester interaction, reduces test time, lowers test pin counts, allows parallel testing, and can test high frequency phase lock loops.

I claim:

1. A method for self testing a phase lock loop, the phase lock loop receiving a reference signal of a first frequency for generating an output signal of a second frequency, the method comprising:

providing a pulse having a predetermined window of time which is a multiple of the period of the reference frequency;

counting pulses of the output signal from the phase lock loop during said window of time; and comparing a count of said pulses from the phase lock loop against an expected count of pulses to determine accuracy of the output signal of the phase lock loop.

2. A method as recited in claim 1 wherein said providing a window of time step includes coupling the reference signal to a pulse circuit, said pulse circuit generating a pulse from the reference signal having a duration equal to the window of time thereby retaining a time relationship between said window of time and the output signal of the phase lock loop.

3. A method as recited in claim 2 wherein said coupling the reference frequency to a pulse circuit step includes:

dividing the reference signal with a divide circuit thereby providing a signal of a third frequency having a period larger than the period of the reference signal; and forming said pulse with a gating circuit, said gating circuit being clocked with said signal of said third frequency.

4. A method as recited in claim 3 further including coupling said pulse and the output signal of the phase lock loop to an And gate thereby producing a series of pulses of the second frequency for a time equal to said window of time.

5. A method as recited in claim 4 further including counting said series of pulses with a counter circuit.

6. A method as recited in claim 5 further including porting a count from said counter circuit to an external tester for further calculations.

7. A method for self test of a phase lock loop, the phase lock loop receiving a reference signal of a first frequency and producing an output signal of a second frequency, the second frequency being some multiple of the first frequency, the method comprising:

forming a pulse of a predetermined period from the input signal of the first frequency, said predetermined period being significantly larger than the period of the second frequency produced by the phase lock loop;

coupling said pulse and the output signal of the phase lock loop to an And gate thereby producing a series of pulses of the second frequency for said predetermined period of said pulse;

counting said series of pulses with a counter circuit; and comparing a count of said string of pulses to an expected count of pulses.

8. A method as recited in claim 7 wherein said forming a pulse step includes coupling the input signal of the first frequency to a divider circuit;

dividing the input signal with said divider circuit thereby generating a signal of a third frequency having a period larger than the period of the input signal;

coupling said signal of said third frequency to a gating circuit; and generating said pulse of said predetermined period with said gating circuit.

9. A method as recited in claim 7 further including resetting said divider circuit, said gating circuit, and said counting circuit prior to counting said series of pulses.

10. An integrated circuit with self test comprising:

a phase lock loop including an input for receiving an input signal of a first frequency and an output for providing an output signal of a second frequency;

a pulse circuit including an input for receiving said input signal of said first frequency and an output for providing a pulse of a predetermined period, said predetermined period being a multiple of the period of said output signal of said phase lock loop;

an And gate including an input coupled to said output of said phase lock loop, an input coupled to said output of said pulse circuit, and an output, said And gate providing a series of pulses of said second frequency during said predetermined period of said pulse; and a counter circuit including an input coupled to said output of said And gate and a plurality of outputs for providing a count of said series of pulses, said count being compared with an expected count to determine accuracy of said phase lock loop.

11. An integrated circuit as recited in claim 10 further including an output multiplexer circuit including a plurality of inputs coupled to said plurality of outputs of said counter circuit and an output for serial porting said count from said counter circuit.

12. An integrated circuit as recited in claim 10 wherein said pulse circuit comprises:

a divider circuit including an input for receiving said reference signal and an output for providing a signal of a third frequency having a period larger than the period of the reference signal; and a gating circuit including an input receiving said signal of said third frequency and an output for providing said pulse of said predetermined period.

13. An integrated circuit as recited in claim 12 wherein said divider circuit comprises a string of series clocked D-flip flops, wherein each D-flip flop having its Qbar output coupled to its D-input, wherein the first D-flip flop of said string of series clocked D-flip flops having a clock input corresponding to said input of said divider circuit, wherein each D-flip flop other than said first D-flip flop having a D-input coupled to a preceeding D-flip flop Q output, and wherein a last D-flip flop of said string of series clocked D-flip flops having a Q output corresponding to said output of said divider circuit.

14. An integrated circuit as recited in claim 12 wherein said gating circuit comprises a shift register and a nor gate, said shift register comprises a string of series coupled D-flip flops, wherein a first D-flip flop of said string of D-flip flops includes a D-input coupled to a terminal of a power supply and a Qbar output, wherein each D-flip flop of said series coupled D-flip flops having a clock input, said clock inputs being coupled in common and corresponding to said input of said gating circuit, wherein each D-flip flop of said string of D-flip flops other than said first D-flip flop having a D-input coupled to a Q output of a preceeding D-flip flop, and wherein said nor gate includes an input coupled to said Qbar output of said first D-flip flop, an input coupled to said Q output of a last D-flip flop of said series coupled D-flip flops, and an output corresponding to said output of said gating circuit.

15. An integrated circuit as recited in claim 12 wherein said divider circuit, said gating circuit, and said counter circuit being resettable to allow retesting of said phase lock loop.

* * * * *